US012603458B2

(12) United States Patent
Gravermann et al.

(10) Patent No.: US 12,603,458 B2
(45) Date of Patent: Apr. 14, 2026

(54) SENSORED INSULATION PLUG

(71) Applicant: 3M INNOVATIVE PROPERTIES COMPANY, St. Paul, MN (US)

(72) Inventors: Mark Gravermann, Erkelenz (DE);
Gunther A. J. Stollwerck, Krefeld (DE); Christopher R. Wilson, Austin, TX (US); Rainer Reeken, Dormagen (DE); Martin A. Milek, Oberhausen (DE); Mirco Gunjaca, Nottuln (DE); Christine B. Bund, Wuppertal (DE)

(73) Assignee: 3M Innovative Properties Company, St. Paul, MN (US)

( * ) Notice: Subject to any disclaimer, the term of this patent is extended or adjusted under 35 U.S.C. 154(b) by 427 days.

(21) Appl. No.: 18/245,677

(22) PCT Filed: Sep. 3, 2021

(86) PCT No.: PCT/IB2021/058078
§ 371 (c)(1),
(2) Date: Mar. 16, 2023

(87) PCT Pub. No.: WO2022/069971
PCT Pub. Date: Apr. 7, 2022

(65) Prior Publication Data
US 2023/0361503 A1    Nov. 9, 2023

(30) Foreign Application Priority Data

Oct. 1, 2020    (EP) ..................................... 20199577

(51) Int. Cl.
H01R 13/53       (2006.01)
G01R 15/06       (2006.01)
(Continued)

(52) U.S. Cl.
CPC ............. H01R 13/53 (2013.01); G01R 15/06 (2013.01); G01R 19/0084 (2013.01); H01R 13/6581 (2013.01)

(58) Field of Classification Search
CPC .... H01R 13/53; H01R 13/6581; G01R 15/06; G01R 19/0084
(Continued)

(56) References Cited

U.S. PATENT DOCUMENTS 5,114,357 A * 5/1992 Luzzi ................... H02G 15/103
                                                        439/805
5,573,410 A * 11/1996 Stepniak ................ H01R 13/53
                                                        29/883
(Continued)

FOREIGN PATENT DOCUMENTS

CA        2522912 C   * 11/2006
CN        208507447 U     2/2019
(Continued)

OTHER PUBLICATIONS

1507 Extended EP Search Report for EP20199577.6, Date Mar. 9, 2021, 3pgs.
(Continued)

*Primary Examiner* — Peter G Leigh
(74) *Attorney, Agent, or Firm* — Gregg H. Rosenblatt

(57) ABSTRACT

A sensored insulation plug for a medium-voltage or high-voltage separable connector in a power distribution network of a national grid, and operable to insulate a connection element of the separable connector on elevated voltage and to sense the elevated voltage. The sensored insulation plug has an outer shape generally symmetrical about a plug axis defining axial directions and radial directions, and comprises a plug body formed by an insulating material, and a primary capacitor, operable as a high-voltage capacitor in a voltage (Continued)

divider for sensing the elevated voltage. The primary capacitor has a high-voltage electrode for direct electrical connection to the elevated voltage, a sensing electrode of a tubular shape, embedded in the plug body, arranged around the high-voltage electrode and extending, in axial directions, between a first axial edge position (B) and a second axial edge position (A), and a dielectric formed by a portion of the insulating material arranged between at least a portion of the sensing electrode and at least a portion of the high-voltage electrode. A shield electrode of generally tubular shape, embedded in the plug body, is arranged around the sensing electrode and extending in axial directions at least between the first axial edge (B) position and the second axial edge position (A), and comprises a protruding portion extending in axial direction beyond the first axial edge position (B), such as to enhance electrical shielding, by the shield electrode, of the sensing electrode against external electrical fields.

14 Claims, 3 Drawing Sheets

(51) Int. Cl.
   *G01R 19/00*      (2006.01)
   *H01R 13/6581*      (2011.01)
(58) Field of Classification Search
   USPC .................................... 439/296, 138; 29/858
   See application file for complete search history.

(56) References Cited

U.S. PATENT DOCUMENTS

| | | | | |
|---|---|---|---|---|
| 6,031,368 A * | 2/2000 | Klippel | ................. | G01R 15/06 |
| | | | | 324/133 |
| 7,199,571 B2 * | 4/2007 | Johnson | ................. | G01R 15/16 |
| | | | | 439/607.41 |
| 7,798,829 B2 * | 9/2010 | Fong | ...................... | H01R 43/24 |
| | | | | 439/148 |
| 7,878,849 B2 * | 2/2011 | Hughes | .................. | H02G 15/18 |
| | | | | 439/578 |
| 8,109,776 B2 * | 2/2012 | Hughes | .................. | H01R 13/46 |
| | | | | 439/282 |
| 9,124,050 B2 * | 9/2015 | Siebens | ................ | H01R 13/207 |
| 9,739,807 B2 * | 8/2017 | Barba Jimenez | ...... | G01R 15/18 |
| 9,954,315 B2 * | 4/2018 | Siebens | .................. | H01R 13/53 |
| 2009/0100675 A1 * | 4/2009 | Hughes | ............. | H01R 13/6599 |
| | | | | 29/887 |
| 2009/0215299 A1 * | 8/2009 | Hughes | .................. | H01R 13/46 |
| | | | | 29/592.1 |
| 2009/0255106 A1 * | 10/2009 | Hughes | .................... | H02G 1/14 |
| | | | | 29/426.4 |
| 2009/0258547 A1 * | 10/2009 | Hughes | .................. | H02G 15/18 |
| | | | | 439/730 |
| 2014/0024241 A1 * | 1/2014 | Siebens | ................ | H01R 13/207 |
| | | | | 439/310 |
| 2014/0346023 A1 * | 11/2014 | Siebens | .................. | H01R 13/53 |
| | | | | 200/48 R |
| 2017/0038414 A1 * | 2/2017 | Barba Jimenez | ...... | G01R 15/16 |
| 2018/0100878 A1 * | 4/2018 | Pearce | ................. | G01R 15/181 |
| 2019/0107563 A1 | 4/2019 | Siebens | | |
| 2020/0191832 A1 * | 6/2020 | Djogo | .................... | G01R 15/06 |
| 2020/0203896 A1 * | 6/2020 | Wu | ....................... | G01K 11/265 |

FOREIGN PATENT DOCUMENTS

| | | | | | |
|---|---|---|---|---|---|
| EP | 0691721 B1 | | 8/1998 | | |
| EP | 1521381 A1 | | 4/2005 | | |
| EP | 1521381 B1 | * | 5/2006 | ............... | H04B 3/56 |
| EP | 2696206 A1 | * | 2/2014 | ............... | G01R 1/18 |
| EP | 3882642 A1 | | 9/2021 | | |
| EP | 3910346 A1 | | 11/2021 | | |
| WO | WO-2018211358 A1 | * | 11/2018 | ............. | G01R 15/06 |
| WO | WO-2019186607 A1 | * | 10/2019 | ........ | G01R 19/0084 |
| WO | WO-2019229694 A1 | * | 12/2019 | ............. | G01R 15/06 |
| WO | 2020093397 A1 | | 5/2020 | | |
| WO | 2020124498 A1 | | 6/2020 | | |
| WO | WO-2020131903 A1 | * | 6/2020 | ........... | G01R 15/165 |

OTHER PUBLICATIONS

International Search Report for PCT International Application No. PCT/IB2021/058078, mailed on Dec. 01, 2021, 5 pages.

* cited by examiner

SENSORED INSULATION PLUG

FIELD

The present disclosure relates to voltage sensing devices for high-voltage and medium-voltage power networks, and particularly to voltage sensing devices, such as insulation plugs, that can be connected to separable connectors used in such networks, as well as to processes for manufacturing such voltage sensing devices.

BACKGROUND

Power networks transmitting electrical power in large geographic areas, such as national grids, are becoming more complex to operate because nowadays consumers can generate energy on their premises and feed it into these networks in a decentralized manner, at unpredictable times and in unpredictable amounts. Network operators place voltage sensing devices in electrical installations at key locations of their network, such as in switchgears or transformers to collect information about the current state of their power network.

In a medium-voltage or high-voltage power network, a power cable is typically connected to network apparatus, such as switchgears or transformers, by a separable connector, also often referred to as a removable power connector, mounted at the end of the cable. Such separable connectors have a front cavity to receive a protruding portion of a bushing of the apparatus, and a connection element on high or medium voltage. The connection element is in contact with the cable conductor and can be mechanically and electrically connected to the bushing, e.g. via a threaded stud, accessible through an opposed rear cavity of the separable connector. After installation, the rear cavity is filled with a so-called insulation plug, which insulates the connection element.

Elements of a voltage sensor for measuring the voltage of the connection element of a separable connector—and thereby the voltage of the power cable—can be integrated into the insulation plug, making it a "sensored insulation plug". A sensored insulation plug is described, for example, in the U.S. Pat. No. 6,031,368.

In order to sense the voltage of the connection element with high accuracy, a capacitive voltage divider may be used, of which the dividing ratio is precisely known. The high-voltage portion of such a voltage divider is often a single capacitor of a smaller capacitance, the primary capacitor or the "high-voltage capacitor". Advantageously the primary capacitor, or the entire high-voltage portion, is accommodated in the sensored insulation plug, making use of the insulative properties of the insulation plug.

Where the sensored insulation plug is designed for high-accuracy voltage sensing, external electrical fields can influence an electrode of the primary capacitor to a degree that the voltage is not sensed accurately. In particular, where the primary capacitor is a concentric capacitor in which an outer electrode surrounds an inner electrode, the outer electrode may be affected by external fields. For example, a grounded layer on an outer surface of a separable plug, into which such a sensored insulation plug is inserted, can form a parasitic capacitor with the outer electrode. Depending on the distance of the grounded layer from the outer electrode and on the insulating materials between them, the outer electrode will be on a slightly higher or lower electrical potential, even if the voltage of the connection element has not changed.

This will result in less accurate determination of the voltage by the capacitive voltage divider.

It is therefore advantageous to provide a screen to shield the electrodes of the primary capacitor against external electrical fields. An example of such a screen is described in the international patent application published as WO 2019/186607 A1, in which various layers form an electromagnetic screen, having tubular form, which is adapted to prevent electric field lines external to the sensor, such as electric field lines generated by conductors arranged nearby, to close on a first internal electrode or on a second electrode in such a way that the capacitive coupling between the first electrode and the second electrode is immune to the external electric fields.

SUMMARY

It is thus desirable to better protect the primary capacitor against external electric fields. The present disclosure attempts to address this need. It provides, in a first aspect, a sensored insulation plug for being inserted into a rear cavity of a medium-voltage or high-voltage separable connector in a power distribution network of a national grid, and operable to insulate a connection element of the separable connector on elevated voltage and to sense the elevated voltage, the sensored insulation plug having an outer shape generally symmetrical about a plug axis defining axial directions and radial directions, and comprising a) a plug body formed by an insulating material, and b) a primary capacitor, operable as a high-voltage capacitor in a voltage divider for sensing the elevated voltage, the primary capacitor having i) a high-voltage electrode for direct electrical connection to the elevated voltage: ii) a sensing electrode of a tubular shape, embedded in the plug body, arranged around the high-voltage electrode and extending, in axial directions, between a first axial edge position and a second axial edge position: iii) a dielectric formed by a portion of the insulating material arranged between at least a portion of the sensing electrode and at least a portion of the high-voltage electrode, the sensored insulation plug being characterized by further comprising c) a shield electrode of generally tubular shape, embedded in the plug body, arranged around the sensing electrode and extending in axial directions at least between the first axial edge position and the second axial edge position, comprising a protruding portion extending in axial direction beyond the first axial edge position, such as to enhance electrical shielding, by the shield electrode, of the sensing electrode against external electrical fields.

The shield electrode is arranged around the sensing electrode. The sensing electrode is thus circumferentially surrounded by the shield electrode. The shielding is therefore more effective in radial directions and reduces the impact of external electrical fields.

By virtue of the protruding portion of the shield electrode, which extends beyond the first edge of the sensing electrode in axial directions, the shield electrode shields the first edge portion of the sensing electrode against external fields more effectively, and reduces the impact of external electrical fields on the sensing electrode even further, which reduces the dependence of the capacitance of the primary capacitor from external fields and enhances predictability of the dividing ratio of the voltage divider and thereby yields a greater accuracy of the voltage sensor.

The present disclosure relates to voltage sensing devices for use in medium-voltage or high-voltage power distribution networks in which electrical power is distributed via HV/MV power cables, transformers, switchgears, substations etc. with currents of tens or hundreds of amperes and voltages of tens of kilovolts. The term "medium voltage" or "MV" as used herein refers to AC voltages in the range of 1 kilovolt (kV) to 72 kV, whereas the term "high voltage" or "HV" refers to AC voltages of more than 72 kV. Medium voltage and high voltage are collectively referred to herein as "elevated voltage".

In a MV or HV power network, a power cable is typically connected, in a separable manner, to network apparatus, such as switchgears or transformers, by a separable connector, also often referred to as a removable power connector or a removable cable connector, mounted at the end of the cable. Such separable connectors have a front cavity to receive a protruding portion of a bushing of the apparatus, and a connection element on high or medium voltage. The connection element is in contact with the cable conductor and can be mechanically and electrically connected to the bushing via a threaded stud, accessible through an opposed rear cavity of the separable connector. After installation, the rear cavity is filled with a so-called insulation plug, which insulates the connection element.

Many separable connectors are T-shaped or elbow-shaped. A separable connector as referred to herein usually has a front cavity to receive a protruding portion of a bushing of the switchgear or the transformer, and an opposed rear cavity facilitating access to a connection element, such as a cable lug, on elevated voltage inside the separable connector. The connection element is conductive and is electrically and mechanically connected to the power conductor of the power cable. The connection element can be connected mechanically and electrically, e.g. by a conductive threaded stud, to a conductive element of the bushing, so that power can flow from the power cable through the connection element, the stud and the bushing into the switchgear or transformer. When the separable connector is in use, the connection element is on the elevated voltage of the power conductor of the cable.

Certain separable connectors are described in the European patent application EP 0 691 721 A1. Examples of traditional separable connectors are the 3M™ 600 Amp T-Bodies 5815 Series from 3M Co., St. Paul, Minnesota, U.S.A., or the "(M) (P) 480 TB separable tec shape connector" of Nexans Network Solutions N.V., Erembodegem, Belgium.

The rear cavity of a separable connector can receive a matching insulation plug to insulate the connection element and fill the space of the rear cavity with an insulating body to reduce the risk of electrical discharges. Such matching pairs of separable connector and insulation plug are commercially available at moderate cost. In many cases, the mechanical interface between a separable connector and an insulation plug is governed by de-facto standards. Many of such interfaces conform to an existing standard for bushings, some form a Type C interface as described in the German standards DIN EN 50180 for bushings and DIN EN 50181 for plug-in type bushings, others conform to ANSI/IEEE standard 386. Often, bodies of insulation plugs are slightly larger than the rear cavity, so that when the plug is urged into the rear cavity with some force, the surfaces of plug and cavity are in an intimate surface contact, thus reducing the risk of electrical discharges.

The body of a sensored insulation plug according to the present disclosure is shaped for mating with a rear cavity of a separable connector in the same way as the body of a non-sensored insulation plug. The body of the sensored insulation plug may, for example, have a frustro-conical shape for being inserted into a corresponding frustro-conical recess of corresponding shape (the rear cavity) at a rear side of the separable connector for mating the sensored insulation plug with the separable connector.

A connection element of a separable connector is electrically connected to the conductor of the power cable terminated by the separable connector and is on elevated voltage when the cable is in use.

Some separable connectors comprise a connection element such as a cable lug, attached to the end of the central conductor of the power cable and protruding into a space between the front cavity and the rear cavity. The protruding portion of the connection element usually has an aperture or a thread for attachment to a stud or screw which connects the connection element electrically and mechanically, e.g. with a conductor of a bushing.

The connection element serves to electrically and mechanically connect the power cable and the separable connector to a bushing. The high-voltage electrode of the primary capacitor of the sensored insulation plug as described herein is-when in use-electrically connected to the connection element, so that a voltage sensor based on a voltage divider comprising the primary capacitor in its high-voltage portion can sense the elevated voltage of the connection element and thereby of the power cable conductor.

The connection element is electrically connected to the voltage divider such that the voltage divider is usable to sense the elevated voltage of the connection element. For that purpose, the connection element on elevated voltage is electrically connected to the high-voltage electrode of the primary capacitor in the sensored insulation plug which in turn is operable as a high-voltage capacitor in a voltage divider for sensing the elevated voltage.

Also, the high-voltage electrode of the primary capacitor may be not only electrically, but also mechanically connected to the connection element. This mechanical connection is an electrically conductive connection. This mechanical connection may be a direct mechanical connection, i.e. a portion of the high-voltage electrode is connected to the connection element without any intermediate element.

Alternatively, this connection may be an indirect mechanical connection, i.e. a portion of the high-voltage electrode is connected to the connection element via an intermediate element, which is electrically conductive. The sensored insulation plug may thus further comprise an intermediate element which is operable to mechanically and electrically connect the high-voltage electrode with the connection element. Such an intermediate element may be, for example, a contact piece. Such a contact piece may be connectable to the connection element of the separable connector, for example via a conductive threaded stud or screw that is threadedly connected to the contact piece on one side and that can, on the other side, be threadedly engaged with the connection element of the sensored insulation plug.

Hence in certain embodiments the sensored insulation plug further comprises a contact piece, operable to mechanically and electrically connect the high-voltage electrode with the connection element of the separable connector.

A contact piece of the sensored insulation plug according to the present disclosure may be the high-voltage-electrode, or it may comprise the high-voltage electrode. Where the contact piece comprises the high-voltage electrode, the contact piece may have an engagement portion to engage with an intermediate element connecting the contact piece electrically with the connection element of the separable connector, and an electrode portion forming the high-voltage electrode. The engagement portion and the electrode portion may be formed as a single piece, e.g. as a single piece of metal. Alternatively, they may be formed as separate elements.

The contact piece, or an engagement portion of the contact piece, may comprise a recess to connectingly engage a stud that is connected to the connection element of the separable connector. The contact piece, or an engagement portion of the contact piece, may comprise an internal or external thread to connectingly and threadedly engage a threaded stud that is connected to the connection element of the separable connector.

The outer shape of the sensored insulation plug according to the present disclosure is generally symmetric about a plug axis, e.g. rotationally symmetric about a plug axis. The plug axis may be an axis which is parallel to a design insertion direction, i.e. a direction in which the insulation plug is supposed to be inserted into a separable connector.

The plug axis defines axial directions, which are directions parallel to the plug axis, and radial directions, which are directions orthogonal to the axial directions.

The sensored insulation plug according to the present disclosure comprises a plug body formed by an electrically insulating material. The shape of the plug body generally determines the outer shape of the sensored insulation plug. For durability and reliable functioning over years it is desirable that the plug body be mechanically rigid, has a high dielectric strength, has little variation of its relative permittivity with changes in temperature over the operating temperature range, does not absorb water, and does not age.

The insulating material may be, for example, a hardened or cured, i.e. a solidified, epoxy resin or a hardened or cured mixture of an epoxy resin with other materials, such as fillers, or a hardened or cured polyurethane resin or a hardened or cured mixture of a polyurethane resin with other materials, such as fillers. Useful fillers are, for example, $SiO_2$ or $Al_2O_3$ or other electrically insulating inorganic materials. Alternatively, the insulating material may be or may comprise, for example, a ceramic material.

The plug body may have a generally rotationally symmetric outer shape. In order to be usable with many existing separable connectors the plug body may have a generally frustro-conical outer shape, such that it can fill a frustro-conical rear cavity of the separable connector without leaving too many or too large voids between the inner surface of the rear cavity and the outer surface of the plug body.

Advantageously the sensored insulation plug, and in particular the shape of the plug body of the sensored insulation plug, is adapted to conform to DIN EN 50180 or to DIN EN 50181, which are German industry standards for bushings. For use in other geographies it may be more advantageous that the sensored insulation plug, and in particular the shape of the plug body of the sensored insulation plug, is adapted to conform to industry standard ANSI/IEEE 386. When referring to an industry standard herein, the latest version as in force on 21 Sep. 2020 is meant, e.g. ANSI/IEEE standard 386-2016, published 14 Oct. 2016, is deemed to be the latest version in force on 21 Sep. 2020. Conformance to an industry standard, although not a requirement for sensored insulation plugs as described herein, may generally help obtain compatibility with a greater number of separable connectors.

Hence in certain embodiments the plug body is shaped such as to conform with the ANSI/IEEE standard 386 in its latest version as in force on 21 Sep. 2020.

The primary capacitor of the sensored insulation plug described herein is operable as a high-voltage capacitor in a voltage divider, which in use is electrically connected between the connection element on elevated voltage and electrical ground, for sensing the elevated voltage of the connection element of the separable connector. The voltage divider comprises, in its high-voltage portion, the primary capacitor of a sensored insulation plug according to the present disclosure.

The voltage divider may be a capacitive voltage divider. In other words, both its high-voltage portion and its low-voltage portion (defined below) each consist of one or more capacitors, respectively, and are free of impedance elements of other types, such as resistors or inductances. In other embodiments the voltage divider is a mixed voltage divider, in which the high-voltage portion may comprise, beyond the primary capacitor, an inductance or a resistor, and in which the low-voltage portion comprises a capacitor, and/or an inductance and/or a resistor.

The high-voltage portion of a voltage divider is the portion that is electrically arranged between a signal contact, at which a divided voltage can be picked up, and a contact for connection to the elevated voltage which is to be sensed. The low-voltage portion of the voltage divider is the portion that is electrically arranged between that signal contact and a contact for connection to electrical ground.

The primary capacitor may be the only impedance element of the high-voltage portion of the voltage divider. In other words, there may be no other capacitor(s) and no other impedance elements electrically arranged between the elevated voltage and the signal contact of the voltage divider.

Independent of the number of capacitors in the voltage divider, the primary capacitor may be the first impedance element in an electrical chain of impedance elements of the voltage divider. In this chain, the primary capacitor may be arranged electrically at the end of the chain and may be adapted to be electrically connected directly with the elevated voltage. The primary capacitor would thus be the impedance element of the voltage divider which "sees" the full elevated voltage on its high-voltage electrode.

The primary capacitor may be directly electrically connected to the elevated voltage of the connection element, that is, the primary capacitor is electrically connected to the connection element without any intermediate element. In particular, the high-voltage electrode of the primary capacitor may be directly electrically connected to the elevated voltage of the connection element. This direct electrical connection may be established through a contact piece, which is a mechanical element between the high-voltage electrode and the connection element of the separable connector.

The expressions "directly electrically connected" and "direct electrical connection" as used herein refer to a fully conductive (ohmic) electrical connection between two elements, e.g. via a wire or via a conductive path on a PCB or via a conductive element, without any intermediate electrical component such as a resistor, a capacitor or an inductor, being arranged electrically between the two elements.

Like most capacitors, the primary capacitor has two opposed electrodes (namely its high-voltage electrode and its sensing electrode) and a dielectric between the electrodes. The dielectric is formed by a portion of the plug body in that some of the plug body's insulating material is arranged between at least a portion of the sensing electrode and a portion of the high-voltage electrode, or in that some of the plug body's insulating material is arranged between the sensing electrode and the high-voltage electrode.

The sensing electrode is generally of a tubular shape and is arranged around the high-voltage electrode, e.g. concentrically arranged around the high-voltage electrode, or at least around an axial portion of the high-voltage electrode. The sensing electrode extends, in axial directions, between a first axial edge position and a second axial edge position. The difference in edge positions relates to the maximum axial extension, i.e. the length, of the sensing electrode. Where an edge of the sensing electrode is not straight but uneven or "ragged", the greatest axial extension of the sensing electrode in axial direction determines the respective edge position.

The sensing electrode has an extension in axial directions and comprises edge portions opposed to each other in axial direction. Each edge portion comprises a respective edge of the sensing electrode, termed first edge and second edge herein. At at least one edge of the sensing electrode the protruding portion of the shield electrode protrudes beyond the length of the sensing electrode in an axial direction. This edge of the sensing electrode defines the first axial edge position.

The sensing electrode of the primary capacitor may be connected to, or formed with, other components, e.g. components for support or electrical or mechanical connection of the sensing electrode, to form a sensing electrode assembly. Within a sensing electrode assembly, the sensing electrode is the element that is arranged opposite to the high-voltage electrode and that determines, in combination with the high-voltage electrode and the dielectric, the capacitance of the primary capacitor.

The sensing electrode of the primary capacitor is embedded in the plug body. A portion of the sensing electrode, or the entire sensing electrode, may be in surface contact with the insulating material of the plug body.

The sensing electrode may be electrically connected, or connectable, to a low-voltage capacitor, such that the primary capacitor and the low-voltage capacitor form a voltage divider for sensing the elevated voltage of a connection element of a separable connector. The primary capacitor may be comprised in, or may form, the high-voltage portion of the voltage divider, while the low-voltage capacitor may be comprised in, or may form, the low-voltage portion of the voltage divider.

Generally, the sensing electrode may be rigid. Alternatively, the sensing electrode may be flexible. A flexible sensing electrode may be made from, or comprise, for example, a conductive layer on a flexible foil or on a paper substrate or a flexible metal foil or a flexible metal sheet. In certain embodiments, a flexible sensing electrode comprises a flexible stainless steel foil, a flexible copper foil or a flexible aluminium foil. A flexible sensing electrode may be comprised, for example, in a flexible circuit board, such as a flexible printed circuit board. Where the plug body is manufactured using a curable insulating material, e.g. epoxy, in a casting process or molding process, a flexible sensing electrode can move during the curing and related shrinking of the insulating material as the insulating material solidifies. A flexible sensing electrode can thus "follow" the shrinking insulating material as it solidifies and shrinks. This may result in a lower risk of delamination between the sensing electrode and the insulating material and in a lower risk of voids being generated in the plug body. Less voids generally means less risk of electrical discharges, making the sensored insulation plug more reliable.

The sensing electrode may be formed from a metal foil, such as from a copper foil or from a silver, stainless steel or aluminium foil. The sensing electrode may be formed from a metal sheet, such as from a copper sheet or from a silver, stainless steel or aluminium sheet, for example. The sensing electrode may be formed as a continuous element. Alternatively, the sensing electrode may be formed as a perforated element comprising perforations or apertures extending through the sensing electrode in its thickness direction. A perforated sensing electrode may help reduce delamination and formation of voids between the sensing electrode and the material of the plug body in which the sensing electrode is embedded, as portions of the material on one side of the sensing electrode may be mechanically connected to portions on the other side of the sensing electrode via portions of the material within the perforations.

For elevated voltages of about 50 kV, frequencies of about 50 Hz and target dividing ratios of the voltage divider of about 5000, a suitable capacitance of the primary capacitor is in the order of 30 pF (Picofarad). When designing the primary capacitor, further factors like the permittivity of the insulating material and the geometry of the electrodes must be taken into account, as is generally known.

The expression "embedded in the plug body" as used herein refers to being surrounded completely by portions of the plug body. In particular, an electrode is considered embedded in the plug body if the plug body is cast or molded around the electrode.

The high-voltage electrode of the primary capacitor may be embedded in the plug body. A portion of an embedded high-voltage electrode, or an entire embedded high-voltage electrode, may be in surface contact with the insulating material of the plug body.

The high-voltage electrode of the primary capacitor may be connected to, or formed with, other components, e.g. components for support or electrical or mechanical connection of the high-voltage electrode, to form a high-voltage electrode assembly. Within a high-voltage electrode assembly, the high-voltage electrode is the element that is arranged opposite to the sensing electrode and that determines, in combination with the sensing electrode and the dielectric, the capacitance of the primary capacitor.

The shield electrode is arranged around the sensing electrode in order to help shield the sensing electrode of the primary capacitor against external electrical fields and thereby to improve the accuracy of the voltage sensing.

The shield electrode has a generally tubular shape. It may have, for example, a generally circular cross section, a generally elliptical cross section, or a generally polygonal cross section, such as a rectangular, square, pentagonal, hexagonal or octagonal cross section.

In certain embodiments the shield electrode has a circular cross section. Shield electrodes of circular cross section are cost-effective to manufacture and can be easily fitted within an axially symmetric sensored insulation plug.

The tubular shape defines a length direction of the shield electrode. The shield electrode may be advantageously arranged such that its length direction extends in an axial direction of the plug body.

The shield electrode may be rotationally symmetric about its length direction. It may be arranged such that its symmetry axis coincides with the plug axis of the sensored insulation plug.

In certain embodiments the sensing electrode has a rotationally symmetric shape, the shield electrode has a rotationally symmetric shape, and the shield electrode is arranged concentrically around the sensing electrode. Such a concentric arrangement provides for an even shielding, a low risk of electric discharge, and is cost-effective to manufacture.

In certain preferred embodiments, the high-voltage electrode is shaped and arranged such as to be generally rotationally symmetric about the plug axis of the sensored insulation plug, and the sensing electrode is shaped and arranged such as to be generally rotationally symmetric about the plug axis of the sensored insulation plug. The high-voltage electrode and the sensing electrode may thus be arranged coaxially, or concentrically, with the sensing electrode being arranged around the high-voltage electrode. The sensing electrode being arranged around the high-voltage electrode implies that the sensing electrode, or at least an axial portion of the sensing electrode, is arranged radially outward from the high-voltage electrode and surrounds the high-voltage electrode.

In certain of these embodiments, also the shielding electrode is shaped and arranged such as to be rotationally symmetric about the plug axis. The shielding electrode and the high-voltage electrode and the sensing electrode may thus be arranged coaxially, or concentrically, about a common axis with the shielding electrode being arranged around the sensing electrode, and the sensing electrode being arranged around the high-voltage electrode. The shielding electrode being arranged around the sensing electrode implies that the shielding electrode, or at least a portion of the shielding electrode, is arranged radially outward from the sensing electrode and surrounds the sensing electrode.

In certain embodiments, the high-voltage electrode is rotationally symmetric about a high-voltage electrode axis, the sensing electrode is rotationally symmetric about a sensing electrode axis, the shield electrode is rotationally symmetric about a shield electrode axis, and the high-voltage electrode axis, the sensing electrode axis and the shield electrode axis coincide with the plug axis. Such a highly symmetric concentric arrangement may provide for a lower risk of electrical discharge between electrodes and an even shielding. The electrode may be cost-effective to manufacture, and the sensored insulation plug may be quicker to assemble.

In certain embodiments of the sensored insulation plug according to this disclosure, the shield electrode is arranged around the full perimeter of the sensing electrode. This means that a radius vector, starting perpendicularly from a point radially inside of the sensing electrode, through any point of the sensing electrode hits the shield electrode. The term "around the full perimeter of the sensing electrode" refers to a full 360° circumferential extension of the shield electrode, without any interruption, aperture or gap in the shield electrode, around the sensing electrode. The sensing electrode is thus circumferentially surrounded completely by the shield electrode, without any interruptions, apertures or gaps in the shield electrode. The shielding of the sensing electrode is therefore more effective in radial directions and further reduces the impact of external electrical fields.

The sensing electrode extends, in axial directions, between a first axial edge position and a second axial edge position. The first and the second axial edge positions are defined by the position and length of the sensing electrode. The shield electrode is longer than the sensing electrode, so that it extends not only between the second axial edge position and the first axial edge position but extends beyond the first axial edge position. "Extension beyond the first axial edge position" refers to an extension beyond the first axial edge position as viewed from a central portion of the shield electrode, i.e. a portion located between the first and the second axial edge positions.

In certain embodiments, the shield electrode extends beyond the first axial edge position and also beyond the second axial edge position. This arrangement may help improve the shielding of the sensing electrode against external electrical fields even further. In these embodiments the shield electrode further comprises a second protruding portion extending in axial direction beyond the second axial edge position, such as to enhance electrical shielding, by the shield electrode, of the sensing electrode against external electrical fields.

For better shielding, a portion of the shield electrode extends beyond an edge of the sensing electrode in an axial direction. The axial position of the edge of the sensing electrode, beyond which the protruding portion of the shield electrode protrudes, is referred to as the first axial edge position. In other words, the axial position of that edge is marked by the first axial edge position. The sensing electrode may be elongated and arranged such that a length direction of the sensing electrode is an axial direction, so that a portion of the shield electrode extends beyond the edge of the sensing electrode in a length direction of the sensing electrode.

In certain embodiments the protruding portion extends in axial direction beyond the first axial edge position by at least 1 millimeter, by at least 5 millimeters, or by at least 10 millimeters. Generally, the further the protruding portion protrudes beyond the first axial edge position, the more effective the shielding of the sensing electrode is expected to be. In certain preferred embodiments, the protruding portion extends in axial direction beyond the first axial edge position by at least 10 millimeters or even by at least 20 millimeters.

This protruding portion may have a cross section that is identical in shape and size with the cross section of the remaining (i.e. non-protruding) portion, the "remainder", of the shield electrode. The shield electrode, including the protruding portion, may be integrally formed as a single piece, such as a single sheet or foil.

In certain embodiments the protruding portion is separately formed from the remainder of the shield electrode and is electrically and mechanically connected to the remainder of the shield electrode. This may provide more flexibility in manufacturing or allow for different amounts of protrusion to be implemented easily starting from an identical base portion of the shield electrode, resulting in a more cost-effective production of a variety of shield electrode geometries.

In other embodiments, the protruding portion and the remainder of the shield electrode are integrally formed as a single piece. This may allow for easier assembly of the sensored insulation plug and greater structural strength and related increased reliability of the shield electrode.

In certain embodiments the sensing electrode has a straight tubular shape and the shield electrode has a straight tubular shape, both electrodes are arranged coaxially and concentrically to each other, similar to a shorter tube arranged concentrically in a longer tube. The greater length of the shield electrode, compared to the length of the sensing electrode, is due to the presence of the protruding portion which increases the length of the shield electrode such that it extends beyond the first axial edge position.

The shield electrode may be formed from a metal foil, such as from a copper foil or from a silver, stainless steel or aluminium foil. The shield electrode may be formed from a metal sheet, such as from a copper sheet or from a silver, stainless steel or aluminium sheet, for example.

The shield electrode may be formed as a continuous element. Such a continuous element has no gaps, through-holes or apertures interrupting the continuous element. A continuous shield electrode may provide for effective shielding and mechanical strength.

The protruding portion of the shield electrode may comprise a plurality of radial through-holes. Alternatively, the entire shield electrode may comprise a plurality of radial through-holes. During production of the sensored insulation plug as described herein, such through-holes or apertures may allow for liquid resin forming the plug body to enter more easily the space between the shield electrode and the sensing electrode, before the resin solidifies and forms the plug body. The solidified resin forms the insulating material of the plug body.

In certain embodiments, only the protruding portion of the shield electrode comprises a plurality of radial through-holes, and the remainder of the shield electrode is continuous. During production of the sensored insulation plug as described herein, such through-holes or apertures may allow for liquid resin forming the plug body to enter more easily the space between the protruding portion of the shield electrode and the high-voltage electrode, before the resin solidifies and forms the insulating material of the plug body.

Generally, the shielding electrode may be rigid. Alternatively, the shielding electrode may be flexible. A flexible shielding electrode may be made from, or comprise, for example, a conductive layer on a flexible foil or on a paper substrate or a flexible metal foil or a flexible metal sheet. In certain embodiments, a flexible shielding electrode comprises a flexible stainless steel foil, a flexible copper foil or a flexible aluminium foil. A flexible shielding electrode may be comprised, for example, in a flexible circuit board, such as a flexible printed circuit board. Where the plug body is manufactured using a curable insulating material, e.g. epoxy, in a casting process or molding process, a flexible shielding electrode can move during the curing and related shrinking of the insulating material as the insulating material solidifies. A flexible shielding electrode can thus "follow" the shrinking insulating material as it solidifies and shrinks. This may result in a lower risk of delamination between the shielding electrode and the insulating material and in a lower risk of voids being generated in the plug body. Less voids generally means less risk of electrical discharges, making the sensored insulation plug more reliable.

In certain embodiments the shield electrode comprises a conductive layer arranged on an electrically insulating substrate.

In certain embodiments the shield electrode is formed by a conductive layer of a circuit board, e.g. of a printed circuit board ("PCB"). The shield electrode is thus comprised in the circuit board. It may be, for example, applied on a substrate of the circuit board. The conductive layer may be arranged on an outer surface of the circuit board, or it may be arranged within the circuit board. The circuit board may be of a generally tubular shape for the shield electrode to be of a generally tubular shape. The circuit board may be, for example, a rigid circuit board or a flexible circuit board. Rigid circuit boards are generally stiff, they often comprise an insulating substrate like an FR-2 or an FR-4 material, both widely known from printed circuit boards. The substrate of a circuit board provides mechanical strength to the circuit board. Flexible circuit boards can be flexed and bent, as is generally known. They comprise a flexible substrate like, for example, Kapton or a polyimide film on which conductive traces are applied that connect electronic elements mounted on the surface of the substrate.

The circuit board may have more than the one conductive layer forming the shield electrode. A circuit board comprising more than one conductive layer is referred to as a "multilayer board" herein. The circuit board comprising the shielding electrode may thus be a multilayer board, such as a multilayer printed circuit board. A multilayer board may be rigid or flexible. It may comprise a rigid insulating substrate (such as FR-2 or FR-4, for example) or a flexible insulating substrate (such as a Kapton film or a polyimide film, for example), where the conductive layers are supported by the substrate, with or without intermediate layers. The multilayer board may be in a generally tubular shape for the shield electrode to have a generally tubular shape. The shield electrode may be formed by a first conductive layer of the multilayer board.

The multilayer board may comprise an electrically insulating layer. The insulating layer may be arranged between the first conductive layer (forming the shield electrode) and the second conductive layer of the multilayer board. The insulating layer may be comprised in, or may be, the substrate of the multilayer board.

Where the shield electrode is formed by a first conductive layer of a multilayer board of generally tubular shape, the second conductive layer of the multilayer board may be arranged radially inward of the first conductive layer. This ensures that the second conductive layer is shielded against external electric fields, as it is enveloped by the shield electrode (the first conductive layer). The insulating layer of the multilayer board, e.g. its substrate, may thereby be arranged radially inward of the shielding electrode and radially outward of the inner conductive layer.

The second conductive layer may be electrically connected to the first conductive layer. The second conductive layer would thus form a second shielding layer, in addition to the first shield layer formed by the first conductive layer. In other words, the shield electrode is formed by the first conductive layer and the second conductive layer. A second shield layer may provide for redundancy, should the first conductive layer fail or be disconnected.

The second, radially inner, conductive layer is located radially closer to the sensing electrode than the first, radially outer, conductive layer. Any parasitic capacitance between the sensing electrode and the second conductive layer will be different from the parasitic capacitance between the sensing electrode and the first conductive layer, in the absence of the second conductive layer. This difference translates into a different capacitance of the primary capacitor and thereby into a different dividing ratio of the voltage divider. Connecting the second conductive layer with the first conductive layer changes the dividing ratio of the voltage divider.

Alternatively, the second conductive layer may be electrically connected to the sensing electrode. The sensing electrode can thereby store more charge carriers, which increases the overall capacitance of the primary capacitor. The change in capacitance causes a change in the dividing ratio of the voltage divider. Hence electrically connecting the second conductive layer with the sensing electrode changes the dividing ratio of the voltage divider as well.

A tubular multilayer board may comprise two, three, four, five or generally a plurality of conductive layers, radially spaced from each other. None or one or two or more of the radially inner conductive layers may be connected to the sensing electrode. None or one or two or more of the radially outer conductive layers may be connected to the shield electrode. Each of these connection configurations results in a different dividing ratio of the voltage divider.

The dividing ratio of the voltage divider is traditionally adjusted to a desired desired target dividing ratio (e.g. 1:10 000) by determining the capacitance of the primary capacitor and selecting a low-voltage capacitor of an appropriate capacitance to be connected between the sensing electrode and electrical ground. However, capacitances of commercially available low-voltage capacitors vary and exhibit tolerances of, for example, ±10%, ±5% or ±1%. In order to obtain the desired target dividing ratio it may be necessary to connect several adjustment capacitors in parallel to the low-voltage capacitor of the voltage divider, and in a calibration step disconnect certain of them, e.g. via switches, such that the disconnection results in a dividing ratio being within a specified range around the target dividing ratio. Certain adjustment capacitors may be provided but initially not connected in parallel to the low-voltage capacitor, and in a calibration step certain of them may be connected in parallel to the low-voltage capacitor, e.g. via switches, such that their connection results in a dividing ratio being within a specified range around the target dividing ratio.

The use of a multilayer board comprising the shield electrode, as described above, can make the use of such adjustment capacitors obsolete. Instead of connecting or disconnecting adjustment capacitors via switches parallel to a low-voltage capacitor, conductive layers of a multilayer board can be selectively connected to, or disconnected from, to the sensing electrode or to the shield electrode in order to obtain a desired dividing ratio of the voltage divider formed by the primary capacitor and a low-voltage capacitor. Each switch may be associated with one conductive layer of the multilayer board for electrically connecting or disconnecting this conductive layer to/from the sensing electrode or to/from the shield electrode. A switch may have a first position in which it connects the conductive layer to the shield electrode and disconnects it from the sensing electrode, and a second position in which it connects the conductive layer to the sensing electrode and disconnects it from the shield electrode. A switch may have a third position in which it disconnects the conductive layer from the shield electrode and from the sensing electrode.

Alternatively, a switch may have a first position in which it connects the conductive layer to the shield electrode, and a second position in which it disconnects the conductive layer from the shield electrode.

Alternatively, a switch may have a first position in which it connects the conductive layer to the sensing electrode, and a second position in which it disconnects the conductive layer from the sensing electrode.

Hence in certain embodiments of the sensored insulation plug according to the present disclosure the shield electrode is formed by a first conductive layer of a multilayer board, the multilayer board further comprising i) a second conductive layer, arranged radially inward of the first conductive layer, and ii) an electrically insulating layer, arranged radially between the first conductive layer and the second conductive layer.

The multilayer board may be comprised in the sensored insulation plug. Hence, in certain embodiments, the sensored insulation plug comprises a multilayer board, and the shield electrode is formed by a first conductive layer of the multilayer board, the multilayer board further comprising i) a second conductive layer, arranged radially inward of the first conductive layer, and ii) an electrically insulating layer, arranged radially between the first conductive layer and the second conductive layer.

A shield electrode formed by a layer of a multilayer board may result in a particularly simple design of the sensored insulation plug. Flexible and rigid circuit boards and multilayer boards are widely available at reasonable cost, so that their use may facilitate a cost-effective design of the sensored insulation plug.

In certain of these embodiments, the multilayer board is flexible, such as a flexible multilayer printed circuit board. A flexible multilayer board can be easily brought into a generally tubular shape. It may be easier to store before being brought into a tubular shape during assembly of the sensored insulation plug.

In certain of these embodiments the sensored insulation plug further comprises a switch, operable to electrically connect the second conductive layer to the sensing electrode and/or to disconnect the second conductive layer from the sensing electrode.

In other ones of these embodiments the sensored insulation plug comprises a switch, operable to electrically connect the second conductive layer to the shield electrode and/or to disconnect the second conductive layer from the shield electrode.

The switch, and any switch, may be, for example, a dip switch. Dip switches are cost-effective and are adapted for saving space in electronic assemblies.

The switch, and any switch, may be arranged such as to be externally accessible. The plug body may comprise a recess providing external access to the switch, e.g. for actuation of the switch by a tool or for manual actuation of the switch. This external access may make calibration of the voltage divider quicker and more cost-effective.

Switches are a convenient and cost-effective means of connecting, reversibly or irreversibly, a conductive layer to an electrode of the sensored insulation plug.

The shield electrode may extend perpendicularly from a support platform. Relative to the support platform, the shield electrode may comprise a proximal end portion and a distal end portion, opposed in axial direction to the proximal end portion. The proximal end portion of the shield electrode may be attached to the support platform. The distal end portion may comprise the protruding portion.

The support platform may be, or comprise, a circuit board, such as a printed circuit board ("PCB"). The support platform may comprise opposed major surfaces, parallel to each other and spaced from each other in a thickness direction. The support platform may be arranged such that its thickness direction is an axial direction of the sensored insulation plug and its major surfaces extend in radial directions.

In certain embodiments the sensing electrode and the shield electrode extend perpendicularly from the support platform. Relative to the support platform, the sensing electrode may comprise a proximal end portion and a distal end portion, opposed in axial direction to the proximal end portion. The proximal end portion of the sensing electrode may be attached to the support platform.

All portions of the shield electrode are electrically connected with each other and are thus on the same voltage. The shield electrode may be held on a fixed voltage, e.g. on ground potential. Where the sensored insulation plug comprises a grounding contact for connection to ground, the shield electrode may be electrically connected to the grounding contact. Alternatively, the shield electrode may be held on a fixed electrical potential different from ground potential. It may be advantageous for the grounding contact to be externally accessible, as this may facilitate connection to an external grounding point. Alternatively, the grounding contact may be connected to a grounding wire leading to outside the sensored insulation plug, e.g. for connecting the grounding contact to an external grounding point.

The sensing electrode is typically on a potential of a few volt, while the shield electrode is typically on ground potential. A major surface of the sensing electrode and a major surface of the shield electrode may thus be arranged relatively close to each other without risking an electrical discharge between them. In some embodiments of the present sensored insulation plug, their opposed major surfaces may be attached to each other via an insulating intermediate layer between their major surfaces. The shield electrode would still protrude beyond the first axial edge position of the sensing electrode. Attaching the sensing electrode to one major surface of an insulating intermediate layer and attaching the shield electrode to an opposed major surface of an insulating intermediate layer may make the electrodes easier to assembly, and the arrangement may save space in certain smaller sensored insulation plugs in which space is scarce.

Hence, in certain embodiments, the sensing electrode comprises a sensing electrode major surface, the shield electrode comprises a shield electrode major surface, and the portion of the sensing electrode major surface is mechanically attached to the portion of the shield electrode major surface by an insulating intermediate layer, arranged between the portion of the shield electrode major surface and the portion of the sensing electrode major surface.

In certain embodiments the sensored insulation plug according to the present disclosure comprises a grounding contact, electrically connected to the shield electrode, for connecting the shield electrode to electrical ground.

The shield electrode is embedded in the plug body. In certain embodiments the insulating material of the plug body, in liquid state, is cast or molded around the sensing electrode and the shield electrode arranged around the sensing electrode, the material is then cured or hardened to solidify, resulting in a solid insulating plug body in which the shield electrode and the sensing electrode are embedded.

The present disclosure provides, in a second aspect, a process to manufacture a sensored insulation plug as described above. It is provided a process of making a sensored insulation plug for being inserted into a rear cavity of a medium-voltage or high-voltage separable connector in a power distribution network of a national grid, and operable to insulate a connection element of the separable connector on elevated voltage and to sense the elevated voltage, comprising the steps, in this sequence, of a) providing a high-voltage electrode for direct electrical connection to the elevated voltage, a sensing electrode of a tubular shape and a shield electrode of generally tubular shape comprising a protruding portion;

b) arranging the sensing electrode around the high-voltage electrode so that the sensing electrode extends in axial directions between a first axial edge position and a second axial edge position: arranging the shield electrode around the sensing electrode so that the shield electrode extends in axial directions at least between the first axial edge position and the second axial edge position and so that the protruding portion extends in axial direction beyond the first axial edge position;

c) molding or casting a liquid insulating material around the high-voltage electrode, the sensing electrode and the shield electrode for forming a plug body of the sensored insulation plug, such that the sensing electrode and the shield electrode are embedded in the insulating material; and d) solidifying the insulating material.

Such a process allows for cost-effective manufacturing of the sensored insulation plug and ensures, in a reliable way, that the plug body contains only few voids. The process also facilitates production of sensored insulation plugs of various outer shapes without the need to redesign the electrodes.

BRIEF DESCRIPTION OF THE FIGURES

The invention will now be described in more detail with reference to the following Figures exemplifying particular embodiments of the invention. Like elements are designated by like reference numbers.

DETAILED DESCRIPTION

Figure 1:
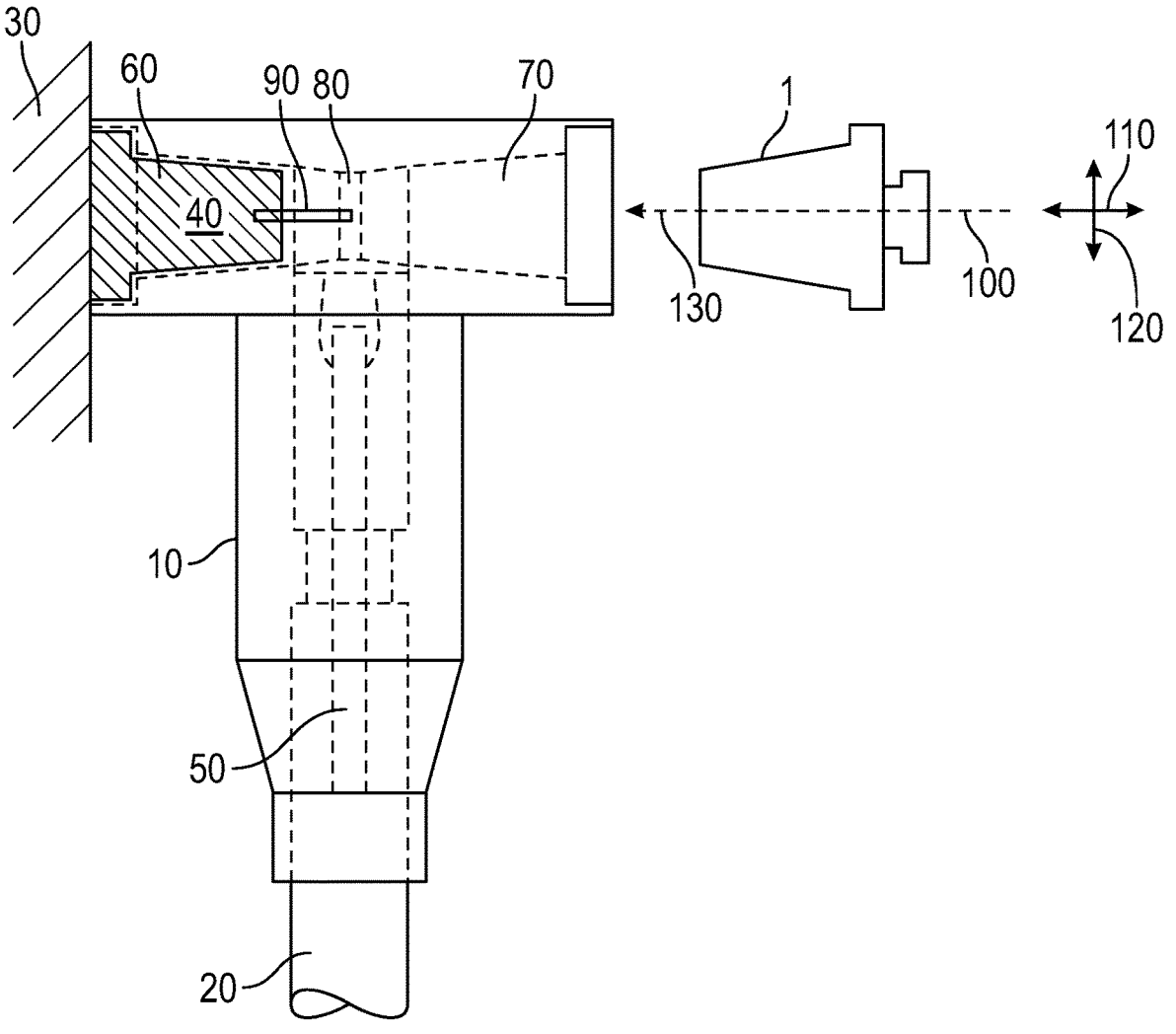
FIG. 1 Sectional view of a separable connector and a first sensored insulation plug according to the present disclosure.

The sectional view of FIG. 1 illustrates a separable connector 10 and a first sensored insulation plug 1 according to the present disclosure. The separable connector 10 is arranged at an end of a medium-voltage power cable 20 and connects, via a bushing 40, the power-carrying central conductor 50 of the cable 20 to a medium-voltage switchgear 30 in a power distribution network of a national grid.

The separable connector 10 is a T-shaped separable connector 10 and comprises a front cavity 60 for receiving the bushing 40, and a rear cavity 70 for receiving an insulation plug of a matching shape. The insulation plug may be a traditional insulation plug without elements of a sensor or a sensored insulation plug 1 according to the present disclosure, shown in FIG. 1 to the right of the rear cavity 70, before being inserted into the rear cavity 70. A traditional insulation plug and a sensored insulation plug 1 according to the present disclosure both serve to electrically insulate a connection element 80 of the separable connector 10, which is electrically connected to the central conductor 50 of the cable 20 and can be electrically and mechanically connected to a conductive component of the bushing 40 via a threaded stud 90. In use, the connection element 80 is on the elevated voltage of the central conductor 50 of the cable.

A sensored insulation plug 1 according to the present disclosure, just like a traditional insulation plug, has an overall frustro-conical outer shape, generally rotationally symmetric about a plug axis 100 which defines axial directions 110 and radial directions 120, which are directions orthogonal to the axial directions 110. The sensored insulation plug 1 can be inserted into the rear cavity 70 by moving it axially in an axial insertion direction 130 into the rear cavity 70 where it can be threadedly engaged—and thereby electrically connected—with the connection element 80 on elevated voltage. The geometry of the sensored insulation plug 1 is adapted to conform to ANSI/IEEE standard 386.

The sensored insulation plug 1 comprises a primary capacitor, which can be electrically connected to the connection element 80 on elevated voltage and which is operable as a high-voltage capacitor in a voltage divider for sensing the elevated voltage, as will be explained in the context of the other Figures.

Figure 2:
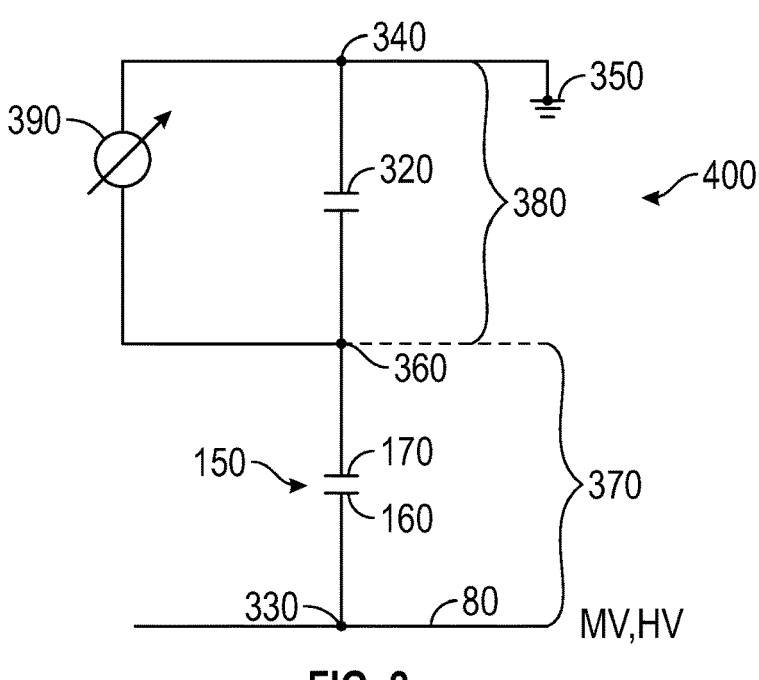
FIG. 2 Circuit diagram of a voltage divider in which a sensored insulation plug according to the present disclosure can be used.

FIG. 2 is a circuit diagram of a voltage divider 400 for sensing the elevated voltage of the separable connector 10 in which the sensored insulation plug 1 of the present disclosure can be used.

The voltage divider 400 for sensing the elevated voltage of the separable connector 10 is shown electrically connected to a connection element 80 of the separable connector 10 on medium or high (i.e. elevated) voltage. The voltage divider 400 comprises a high-voltage capacitor 150, corresponding to the primary capacitor 150 in the sensored insulation plugs 1, 2 described below, and a low-voltage capacitor 320. These two capacitors are electrically connected in series between a high-voltage contact 330 and a low-voltage contact 340, held on electrical ground 350.

The high-voltage contact 330 facilitates electrical connection to the connection element 80 on elevated voltage. The low-voltage contact 340 facilitates connection of the voltage divider 400 to electrical ground 350.

A signal contact 360 is arranged electrically between a high-voltage portion 370 and a low-voltage portion 380 of the voltage divider 400. At the signal contact 360, a divided voltage, also referred to herein as the signal voltage, can be picked up, which varies proportionally with the elevated voltage of the connection element 80. The dividing ratio, i.e. the proportionality factor between the elevated voltage and the signal voltage, depends on the ratio of the total impedance of the high-voltage portion 370 to the total impedance of the low-voltage portion 380 of the voltage divider 400. By measuring the signal voltage of the signal contact 360 using a voltmeter 390 and applying the proportionality factor, the elevated voltage of the connection element 80 can be sensed.

In the illustrated embodiment, the high-voltage portion 370 comprises only one capacitor, namely the primary capacitor 150, with its high-voltage electrode 160 and its sensing electrode 170. In other embodiments the high-voltage portion 370 may comprise, beyond the primary capacitor 150, one or more further capacitors. It may comprise, beyond the primary capacitor 150, one or more further impedance elements, such as one or more resistors and/or one or more inductors.

Similarly, in the illustrated voltage divider 400, the low-voltage portion 380 comprises only one capacitor, namely the low-voltage capacitor 320. In other embodiments the low-voltage portion 380 may comprise, beyond the low-voltage capacitor 320, one or more further capacitors. It may comprise, beyond the low-voltage capacitor 320, one or more further impedance elements, such as one or more resistors and/or one or more inductors.

Figure 3:
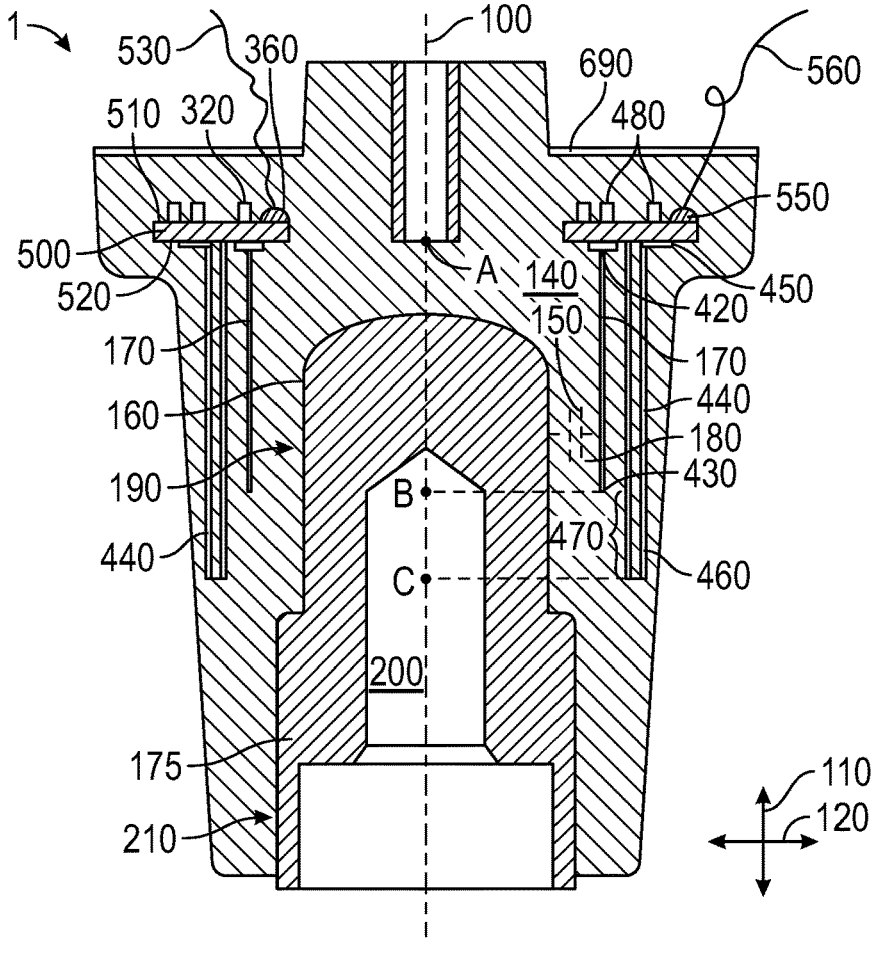
FIG. 3 Sectional view of the first sensored insulation plug according to the present disclosure.

FIG. 3 shows, in a sectional view, the first sensored insulation plug 1 according to the present disclosure of FIG. 1 in greater detail. The sensored insulation plug 1 comprises a plug body 140 of an electrically insulating hardened resin and a primary capacitor 150, formed by a high-voltage electrode 160 and a sensing electrode 170, which are both rotationally symmetric about the plug axis 100. The dielectric of the primary capacitor 150 is formed by a portion 180 of the insulating material of the plug body 140, located between the high-voltage electrode 160 and the sensing electrode 170.

The high-voltage electrode 160 is generally rotationally symmetric about the plug axis 100 and is comprised in an electrode portion 190 of a contact piece 175 made of conductive metal. The contact piece 175 is generally rotationally symmetric about the plug axis 100 and has, further to the electrode portion 190, an engagement portion 210 for mechanical engagement with an intermediate element connecting the contact piece 175 electrically with the connection element 80 of the separable connector 10. The electrode portion 190 forms the high-voltage electrode 160. The engagement portion 210 and the electrode portion 190 are formed as a single piece of metal.

The contact piece 175 comprises a threaded recess 200 to connectingly engage a stud for mechanical and direct, i.e. ohmic, electrical connection of the contact piece 175 to the connection element 80 of the separable connector 10. In use, the entire contact piece 175 and in particular its electrode portion 190 are on the elevated voltage of the connection element 80 of the separable connector 10.

The sensing electrode 170 is a stainless steel sheet of generally tubular shape and is arranged concentrically around the high-voltage electrode 160. A proximal edge 420 of the sensing electrode 170 is attached to a supporting circuit board 500, while a distal edge 430 is axially spaced from the circuit board 500 by the length of the sensing electrode 170. The location of the proximal edge 420 corresponds to an axial edge position A, and the location of the distal edge 430 corresponds to an axial edge position B, both marked on the plug axis 100. Therefore, in axial directions 110, i.e. in the length direction of the sensing electrode 170, the sensing electrode 170 extends between a first axial edge position A and a second axial edge position B.

The sensing electrode 170 is completely surrounded by the insulating material of the plug body 140, in other words it is embedded in the plug body 140.

In particular, a portion 180 of the insulating material is present between the sensing electrode 170 and the high-voltage electrode 160, so that the insulating material forms a dielectric of the primary capacitor 150.

The insulation material of the plug body 140 is a hardened epoxy resin. In manufacturing, the resin in its liquid state is cast or molded around the high-voltage electrode 160, the sensing electrode 170 and the shield electrode 440, in a mold that determines the outer shape of the sensored insulation plug 1. The resin is then cured or hardened to solidify, resulting in a solid insulating plug body 140 in which the shield electrode 440 and the sensing electrode 170 are embedded.

The electrical breakdown strength of the insulating material is high enough to reliably prevent electric discharges between the high-voltage electrode 160 on elevated voltage and the sensing electrode 170 and between the high-voltage electrode 160 and the shield electrode 440.

The sensored insulation plug 1 according to the present disclosure comprises a grounded shield electrode 440 which has a general tubular shape and is axially symmetric with respect to the plug axis 100. The shield electrode 440 is embedded in the plug body 140 and is arranged concentrically around the full perimeter of the sensing electrode 170. It extends perpendicularly from the supporting circuit board 500, and a proximal end portion 450 is attached to the circuit board 500, while an opposed distal end portion 460 is opposed in axial direction 110 to the proximal end portion 450.

While both the sensing electrode 170 and the shield electrode 440 extend from the circuit board 500, the shield electrode 440 is longer than the sensing electrode 170. In other words, a protruding portion 470 of the shield electrode 440 extends, in axial directions 110, further than the sensing electrode 170. The protruding portion 470 extends, in axial directions 110, beyond the first axial edge position B which marks the distal edge 430 of the sensing electrode 170, up to a third axial edge position C. This third axial edge position C is located beyond the first axial edge position B as viewed from a central portion of the shield electrode 440, i.e. a portion located between the first axial edge position B and the second axial edge position A.

By the shield electrode 440 protruding beyond the distal edge 430 of the sensing electrode 170, the electrical shielding of the sensing electrode 170 against external electrical fields is enhanced, facilitating a more precise voltage sensing through the primary capacitor 150. The electrical connection of the shield electrode 440 is done on the circuit board 500 but might alternatively be done outside the circuit board 500, e.g. by a wire soldered to the shield electrode 440 in a middle portion or at the distal end portion 460 of the shield electrode 440.

In the embodiment of FIG. 3 the protruding portion 470 is integrally formed with the other portions of the shield electrode 440. This, however, is not necessary, and the protruding portion 470 may be formed separately and may be attached to the other portions of the shield electrode 440 in alternative embodiments.

In the illustrated embodiment the shield electrode 440 is a stainless steel sheet brought into a straight tubular shape, thus resembling the curved wall of a cylinder. Its proximal portion 450 is soldered to corresponding contacts on the circuit board 500 which hold the shield electrode on electric ground 350. Apertures (not shown) in the stainless steel sheet facilitate, during production of the sensored insulation plug 1, the flow of liquid insulating material into the space between the shield electrode 440 and the sensing electrode 170 and into the space between the shield electrode 440 and the high-voltage electrode 160.

Alternatively, the shield electrode 440 may be formed by a continuous metal sheet, i.e. without apertures, bent into a tubular shape.

Both the shield electrode 440 and the sensing electrode 170 are mechanically supported by the circuit board 500, which is a flat, rigid circuit board 500 of generally annular shape, aligned concentrically with the plug axis 100. The circuit board 500 comprises conductive traces by which electric and electronic components 480, including the sensing electrode 170 and the shield electrode 440, arranged respectively on the upper surface 510 and on the lower surface 520 of the circuit board 500, are electrically connected with each other. In particular, a low-voltage capacitor 320 is arranged on the upper surface 510 of the circuit board 500. This low-voltage capacitor 320 is electrically connected in series between the sensing electrode 170 and a grounding contact 550 held on electrical ground 350. The grounding contact 550 corresponds to the low-voltage contact 340 of the voltage divider 400 in FIG. 2.

The low-voltage capacitor 320 forms the low-voltage portion 380 of the voltage divider 400 for sensing the elevated voltage, with the primary capacitor 150 forming the high-voltage portion 370 of the voltage divider 400.

The circuit board 500 is embedded in the plug body 140. An electrically conductive, grounded lid 690 shields the electric and electronic components 480 on the circuit board 500 against external electrical fields.

The divided voltage of the voltage divider 400 can be accessed at a signal contact 360 on the circuit board 500. A signal wire 530 makes the signal voltage available outside the sensored insulation plug 1, it is led through an aperture in the lid 690. As is generally known for voltage dividers, the signal voltage varies proportionally with the elevated voltage of the high-voltage electrode 160, so that the elevated voltage of the high-voltage electrode 160—and thereby the elevated voltage of the connection element 80 of the separable connector 10—can be sensed by measuring the signal voltage.

The shield electrode 440 is connected to electrical ground via an electrical connection to the grounding contact 550 on the circuit board 500, which in turn can be connected to an external grounding point via a grounding wire 560 leading from the grounding contact 550 through an aperture in the lid 690 to outside the sensored insulation plug 1.

Figure 4:
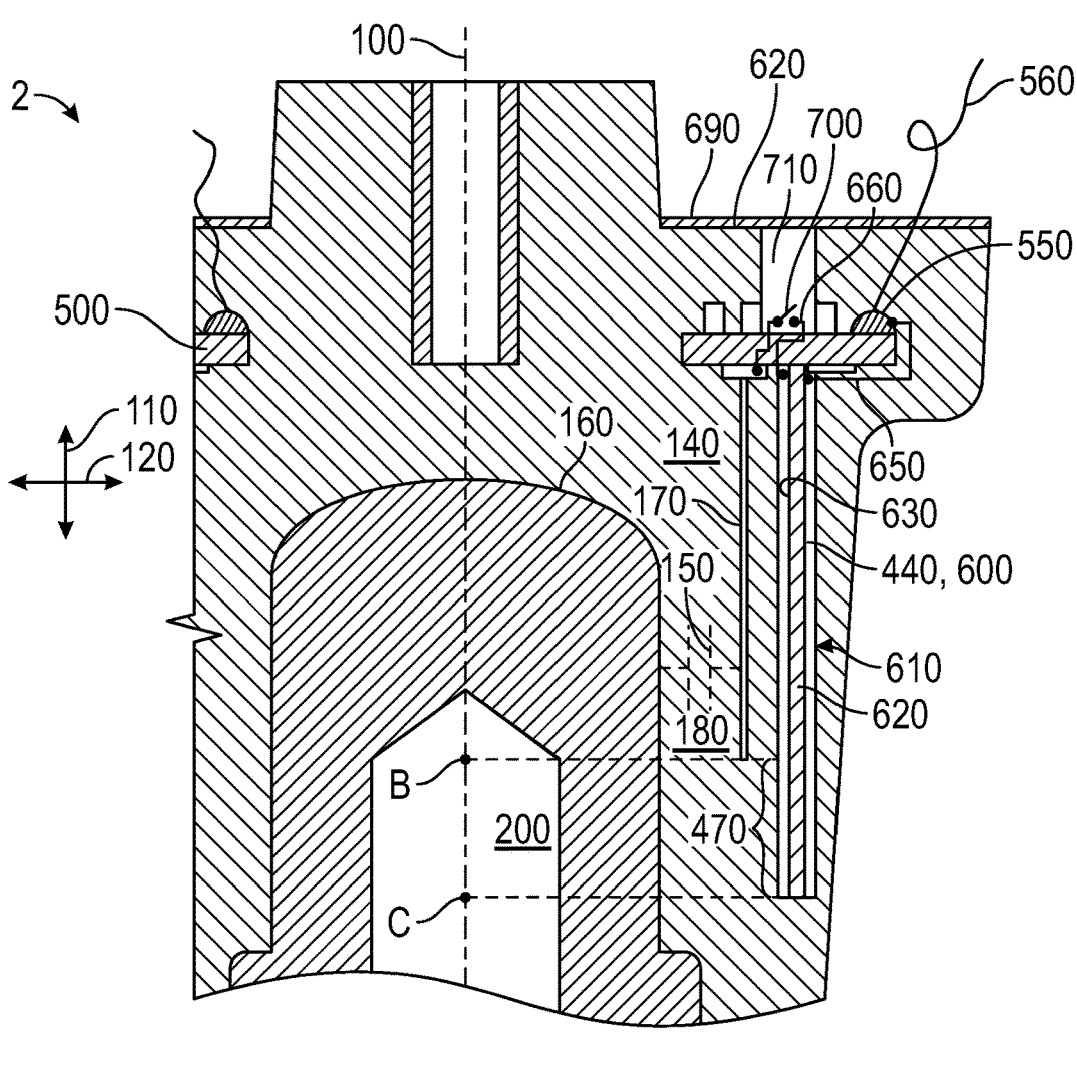
FIG. 4 Sectional partial view of a second sensored insulation plug according to the present disclosure.

FIG. 4 illustrates, in a sectional view, a portion of a second sensored insulation plug 2 according to the present disclosure. This sensored insulation plug 2 is largely identical with the first sensored insulation plug 1 shown in FIG. 3, except that the shielding electrode 440 is formed by a first conductive layer 600 on the radially outer surface of a multilayer flexible printed circuit board ("PCB") 610. The multilayer flexible printed circuit board 610 has an opposed second conductive layer 630 on its radially inner surface, and a central substrate layer 620 of an electrically insulating flexible polyimide material which is arranged radially between the inner and outer conductive layers 600, 630 and supports these conductive layers 600, 630. The inner conductive layer 630 and the outer conductive layer 600 are continuous copper layers 600, 630, coated on the substrate 620 of the multilayer PCB 610.

The outer conductive layer 600 forms the shielding electrode 440 of the sensored insulation plug 2. It is of generally tubular shape, is embedded in the plug body 140, and is arranged around the sensing electrode 170. The outer conductive layer 600 extends in axial directions 110 at least between the first axial edge position B and the second axial edge position A, comprising a protruding portion 470 extending in axial direction 110 beyond the first axial edge position B, such as to enhance electrical shielding, by the shield electrode 440, of the sensing electrode 170 against external electrical fields.

The first conductive layer 600 forming the shield electrode 440 is electrically connected to electrical ground at the grounding contact 550 on the annular circuit board 500, as indicated by a circuit diagram symbol 650 for an electrical connection. Physically, this connection to ground is done via conductive traces on the circuit board 500.

The second conductive layer 630 of the multilayer board 610, arranged radially inward from the first conductive layer 600 relative to the plug axis 100, is electrically connected to the sensing electrode 170 via a switch 700. This electrical connection 660 and the switch 700 are indicated by respective circuit diagram symbols. Physically they are realized by conductive traces and a dip switch 700 on the circuit board 500. In a first, closed position of the switch 700 the second conductive layer 630 is electrically connected to the sensing electrode 170, and in a second, open position of the switch 700, shown in FIG. 4, the second conductive layer 630 is electrically disconnected from the sensing electrode 170. By actuating the switch 700, the capacitance of the primary capacitor 150 is changed, which change translates into a change of the dividing ratio of the voltage divider 400.

After removing a lid 690, the switch 700 is externally accessible in a recess 710 of the plug body 140 to facilitate manual adjustment of the dividing ratio towards a desired dividing ratio of the voltage divider 400 for sensing the elevated voltage of the connection element 80 of the separable connector 10.

Figure 5:
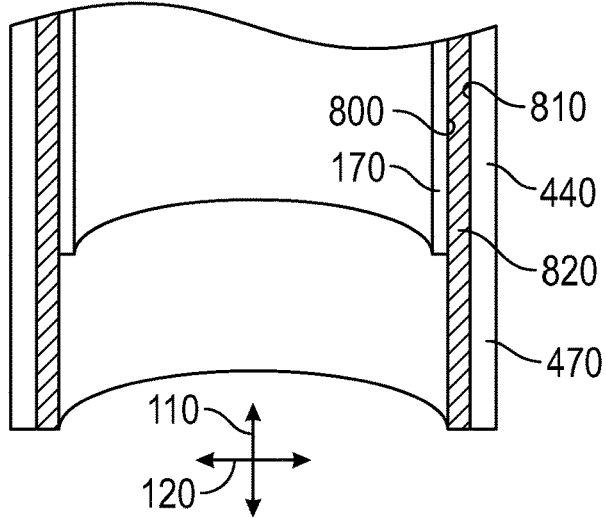
FIG. 5 Sectional perspective view of a portion of a third sensored insulation plug according to the present disclosure in which the shield electrode is attached to the sensing electrode.

FIG. 5 illustrates in a perspective sectional view a section of a third sensored insulation plug according to the present disclosure in which the shield electrode 440 is attached to the sensing electrode 170, while both electrodes 440, 170 are rotationally symmetric and coaxially arranged. The sensing electrode 170 comprises a sensing electrode major surface 800, and the shield electrode 440 comprises a shield electrode major surface 810. The sensing electrode major surface 800 is oriented parallel to the shield electrode major surface 810. The sensing electrode major surface 800 is mechanically attached to the portion of the shield electrode major surface 810 by an insulating intermediate layer 820, arranged between, and in surface contact with, the shield electrode major surface 810 and the sensing electrode major surface 800. The insulating intermediate layer 820 is a rigid board made of a fiber-reinforced resin.

The invention claimed is:

1. A sensored insulation plug for being inserted into a rear cavity of a medium-voltage or high-voltage separable connector in a power distribution network of a national grid, and operable to insulate a connection element of the separable connector on elevated voltage and to sense the elevated voltage, the sensored insulation plug having an outer shape substantially symmetrical about a plug axis defining axial directions and radial directions, and comprising
   a) a plug body formed by an insulating material, and
   b) a primary capacitor, operable as a high-voltage capacitor in a voltage divider for sensing the elevated voltage, the primary capacitor having
      i) a high-voltage electrode for direct electrical connection to the elevated voltage;
      ii) a sensing electrode of a tubular shape, embedded in the plug body, arranged around the high-voltage electrode and extending, in axial directions, between a first axial edge position (B) and a second axial edge position (A);
      iii) a dielectric formed by a portion of the insulating material arranged between at least a portion of the sensing electrode and at least a portion of the high-voltage electrode, the sensored insulation plug being characterized by further comprising
   c) a shield electrode of tubular shape, embedded in the plug body, arranged around the sensing electrode and extending in axial directions at least between the first axial edge (B) position and the second axial edge position (A), comprising a protruding portion extending in axial direction beyond the first axial edge position (B), such as to enhance electrical shielding, by the shield electrode, of the sensing electrode against external electrical fields, wherein the shield electrode is flexible and/or wherein the sensing electrode is flexible.

2. A sensored insulation plug according to claim 1, wherein the shield electrode has a circular cross section.

3. A sensored insulation plug according to claim 1, wherein the shield electrode is arranged around the full perimeter of the sensing electrode.

4. A sensored insulation plug according to claim 1, wherein the protruding portion extends in axial direction beyond the first axial edge position (B) by at least 1 millimeter, by at least 5 millimeters, or by at least 10 millimeters.

5. A sensored insulation plug according to claim 1, wherein the sensing electrode has a rotationally symmetric shape, wherein the shield electrode has a rotationally symmetric shape, and wherein the shield electrode is arranged concentrically around the sensing electrode.

6. A sensored insulation plug according to claim 1, further comprising a grounding contact, electrically connected to the shield electrode, for connecting the shield electrode to electrical ground.

7. A sensored insulation plug according to claim 1, wherein the protruding portion and the remainder of the shield electrode are integrally formed as a single piece.

8. A sensored insulation plug according to claim 1, wherein the shield electrode comprises a plurality of radial through-holes.

9. A sensored insulation plug according to claim 1, wherein the shield electrode is formed by a first conductive layer of a multilayer board, the multilayer board further comprising
   i) a second conductive layer, arranged radially inward of the first conductive layer, and
   ii) an electrically insulating layer, arranged radially between the first conductive layer and the second conductive layer.

10. A sensored insulation plug according to claim 9, further comprising a switch, operable to electrically connect the second conductive layer to the sensing electrode and/or to disconnect the second conductive layer from the sensing electrode.

11. A sensored insulation plug according to claim 9, wherein the multilayer board is flexible, such as a flexible multilayer printed circuit board.

12. A sensored insulation plug according to claim 1, wherein the sensing electrode comprises a sensing electrode major surface, wherein the shield electrode comprises a shield electrode major surface, and wherein the portion of the sensing electrode major surface is mechanically attached to the portion of the shield electrode major surface by an insulating intermediate layer, arranged between the portion of the shield electrode major surface and the portion of the sensing electrode major surface.

13. A sensored insulation plug according to claim 1, wherein the high-voltage electrode is rotationally symmetric about a high-voltage electrode axis, the sensing electrode is rotationally symmetric about a sensing electrode axis, and the shield electrode is rotationally symmetric about a shield electrode axis, and wherein the high-voltage electrode axis, the sensing electrode axis and the shield electrode axis coincide with the plug axis.

14. A process of making a sensored insulation plug for being inserted into a rear cavity of a medium-voltage or high-voltage separable connector in a power distribution network of a national grid, and operable to insulate a connection element of the separable connector on elevated voltage and to sense the elevated voltage, comprising the steps, in this sequence, of
   a) providing a high-voltage electrode for direct electrical connection to the elevated voltage, a sensing electrode of a tubular shape, and a shield electrode of tubular shape comprising a protruding portion, wherein the shield electrode is flexible and/or wherein the sensing electrode is flexible;
   b) arranging the sensing electrode around the high-voltage electrode so that the sensing electrode extends in axial directions between a first axial edge position (B) and a second axial edge position (A); arranging the shield electrode around the sensing electrode so that the shield electrode extends in axial directions at least between the first axial edge position and the second axial edge position and so that the protruding portion extends in axial direction beyond the first axial edge position;
   c) molding or casting a liquid insulating material around the high-voltage electrode, the sensing electrode and the shield electrode for forming a plug body of the sensored insulation plug, such that the sensing electrode and the shield electrode are embedded in the insulating material; and d) solidifying the insulating material.

* * * * *